United States Patent
Kim (10) Patent No.: US 10,825,515 B1
(45) Date of Patent: Nov. 3, 2020

(54) RESISTANCE VARIABLE MEMORY DEVICE INCLUDING STACKED MEMORY CELLS

(71) Applicant: SK hynix Inc., Icheon-si (KR)

(72) Inventor: Dong Keun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/582,861

(22) Filed: Sep. 25, 2019

(30) Foreign Application Priority Data

Apr. 10, 2019 (KR) .................. 10-2019-0041716

(51) Int. Cl.
| | | |
|---|---|---|
| G11C 11/00 | (2006.01) | |
| G11C 13/00 | (2006.01) | |
| G11C 11/16 | (2006.01) | |
| H01L 45/00 | (2006.01) | |

(Continued)

(52) U.S. Cl.
CPC ........ G11C 13/0004 (2013.01); G11C 11/161 (2013.01); G11C 13/003 (2013.01); G11C 13/0007 (2013.01); G11C 13/0026 (2013.01); G11C 13/0028 (2013.01); *G11C 2213/71* (2013.01); *G11C 2213/72* (2013.01); *G11C 2213/79* (2013.01); *H01L 27/2427* (2013.01); *H01L 43/10* (2013.01); *H01L 45/06* (2013.01); *H01L 45/126* (2013.01); *H01L 45/1233* (2013.01); *H01L 45/144* (2013.01)

(58) Field of Classification Search
CPC ... G11C 11/00; G11C 11/161; G11C 13/0007; G11C 13/0026; G11C 13/0028; G11C 13/003; G11C 2213/71; G11C 2213/79; H01L 27/2427

USPC .... 365/163, 46, 94, 100, 113, 129, 148, 158
See application file for complete search history.

(56) References Cited

U.S. PATENT DOCUMENTS

| | | | |
|---|---|---|---|
| 8,848,424 B2 | 9/2014 | Ikeda et al. | |
| 9,361,974 B2 * | 6/2016 | Lee .................. | G11C 13/0023 |
| 9,627,009 B2 | 4/2017 | Petti | |

(Continued)

FOREIGN PATENT DOCUMENTS

| | | |
|---|---|---|
| KR | 1020170097811 A | 8/2017 |
| KR | 1020170128989 A | 11/2017 |

*Primary Examiner* — Harry W Byrne
(74) *Attorney, Agent, or Firm* — William Park & Associates Ltd.

(57) ABSTRACT

A resistance variable memory device may include a plurality of tiles in which memory cells are arranged. The first to third level of the word lines may be sequentially stacked on the plurality of tile regions with the decoding circuits along rows of the tile regions. A first level of the bit lines may be interposed between the first level of the word lines and the second level of the word lines. A first level of the bit lines may be extended along columns of the tile regions. The second level of the bit lines may be interposed between the second level of the word lines and the third level of the word lines. The second level of the bit lines may be extended along the columns of the tile regions. The first and third levels of the word lines at a selected row of a selected tile region among the tile regions and the second level of the bit lines at a selected column of the selected tile region may be controlled by a decoding circuit of the selected tile region. The second level of the word line at the selected row of the selected tile region and the first level of the bit line at the selected column of the selected tile region may be controlled by another decoding circuit of another tile region.

23 Claims, 8 Drawing Sheets

(51) Int. Cl.
*H01L 43/10* (2006.01)
*H01L 27/24* (2006.01)

(56) References Cited

U.S. PATENT DOCUMENTS

| | | |
|---|---|---|
| 10,037,801 B2 * | 7/2018 | Sekar .................. G11C 13/0097 |
| 2016/0049197 A1 | 2/2016 | Park et al. |
| 2016/0093376 A1 * | 3/2016 | Lee .................... G11C 13/0069 365/148 |
| 2017/0117328 A1 | 4/2017 | Terai |

* cited by examiner

RESISTANCE VARIABLE MEMORY DEVICE INCLUDING STACKED MEMORY CELLS

CROSS-REFERENCES TO RELATED APPLICATION

The present application claims priority under 35 U.S.C. § 119(a) to Korean application number 10-2019-0041716, filed on Apr. 10, 2019, in the Korean Intellectual Property Office, which is incorporated herein by reference in its entirety.

BACKGROUND

1. Technical Field

Various embodiments may generally relate to a non-volatile memory device, more particularly, to a resistance variable memory device including a plurality of stacked decks.

2. Related Art

In order to provide a memory device with high capacity and low power consumption, non-volatile type next generation memory devices, without a periodical refresh, have been studied. The next generation memory devices may require a high integration of a dynamic random access memory (DRAM), a non-volatility of a fresh memory, a rapid speed of an SRAM, etc.

A resistance variable memory device, as the next generation memory device, may include a phase changeable RAM (PCRAM), a nano floating gate memory (NFGM), a polymer RAM (PoRAM), a magnetic RAM (MRAM), a ferroelectric RAM (FeRAM), a resistive RAM (ReRAM), etc.

PCRAM may include a switching element and a storage element arranged at an overlapped portion of a word line and a bit line. Thus, a memory cell array structure of the PCRAM may be referred to as a cross point array.

The next generation memory device may also require a high degree of integration. Therefore, a stacked memory cell structure, including the word lines and the bit lines, alternately stacked, may be proposed.

SUMMARY

In example embodiments of the present disclosure, a resistance variable memory device may include a plurality of tiles in which memory cells are arranged. The first to third level of the word lines may be sequentially stacked on the plurality of tile regions with the decoding circuits along rows of the tile regions. A first level of the bit lines may be interposed between the first level of the word lines and the second level of the word lines. A first level of the bit lines may be extended along columns of the tile regions. The second level of the bit lines may be interposed between the second level of the word lines and the third level of the word lines. The second level of the bit lines may be extended along the columns of the tile regions. The first and third levels of the word lines at a selected row of a selected tile region among the tile regions and the second level of the bit lines at a selected column of the selected tile region may be controlled by a decoding circuit of the selected tile region. The second level of the word line at the selected row of the selected tile region and the first level of the bit line at the selected column of the selected tile region may be controlled by another decoding circuit of another tile region.

In example embodiments of the present disclosure, a resistance variable memory device may include a plurality of tiles and a control block. The first deck layer, stacked on each of the tiles with the control block, may include a first level of word lines, a first level of memory cells and a first level of bit lines sequentially stacked on each of the tile regions with the control block. The second deck layer may include a second level of memory cells and a second level of word lines sequentially stacked on the first level of the bit lines of the first deck layer. The third deck layer may include a third level of memory cells and the second level of the bit lines sequentially stacked on the second level of the word lines of the second deck layer. The fourth deck layer may include a fourth level of memory cells and the third level of the word lines sequentially stacked on the second level of the bit lines of the third deck layer. The first level of the word line and the third level of the word line at a selected row of a selected tile region among the tile regions and the second level of the word line at the selected row of a first tile region adjacent to the selected tile region may be controlled by a row switch of the selected tile region. The second level of the bit line at a selected column of the selected tile region and the first level of the bit line at a second tile region adjacent to the selected tile region may be controlled by a column switch of the selected tile region.

In example embodiments of the present disclosure, a resistance variable memory device may include a first deck layer, a second deck layer, a third deck layer, and a fourth deck layer. The first deck layer may include a first level of word lines, a first level of memory cells and a first level of bit lines sequentially stacked on the control block. The second deck layer may include a second level of memory cells and a second level of word lines sequentially stacked on the first level of the bit lines of the first deck layer. The third deck layer may include a third level of memory cells and the second level of the bit lines sequentially stacked on the second level of the word lines of the second deck layer. The fourth deck layer may include a fourth level of memory cells and the third level of the word lines sequentially stacked on the second level of the bit lines of the third deck layer. The first to third levels of the word lines may be intersected with the first and second levels of the bit lines. The first level of the bit lines and the second level of the bit lines may be extended by a unit of two tiles without a disconnection. The first level of the bit lines and the second level of the bit lines may be arranged in a stagger shape to overlap with each other on a selected tile region. The first level of the bit line in the selected tile region may have a central portion electrically connected with the column switch of the selected tile region. The second level of the bit line in the selected tile region may have a central portion electrically connected with the column switch of a tile region adjacent to the selected tile region.

In example embodiments of the present disclosure, a resistance variable memory system may include a processor, a controller, and a memory device. The memory device may include a plurality of tiles in which memory cells are arranged. The first to third level of the word lines may be sequentially stacked on the plurality of tile regions with the decoding circuits along rows of the tile regions. A first level of the bit lines may be interposed between the first level of the word lines and the second level of the word lines. A first level of the bit lines may be extended along columns of the tile regions. The second level of the bit lines may be interposed between the second level of the word lines and the third level of the word lines. The second level of the bit lines may be extended along the columns of the tile regions.

The first and third levels of the word lines at a selected row of a selected tile region among the tile regions and the second level of the bit lines at a selected column of the selected tile region may be controlled by a decoding circuit of the selected tile region. The second level of the word line at the selected row of the selected tile region and the first level of the bit line at the selected column of the selected tile region may be controlled by another decoding circuit of another tile region.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present.

It will be understood that when an element is referred to as being "between" two elements, it can be the only element between the two elements, or one or more intervening elements may also be present.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Figure 1:
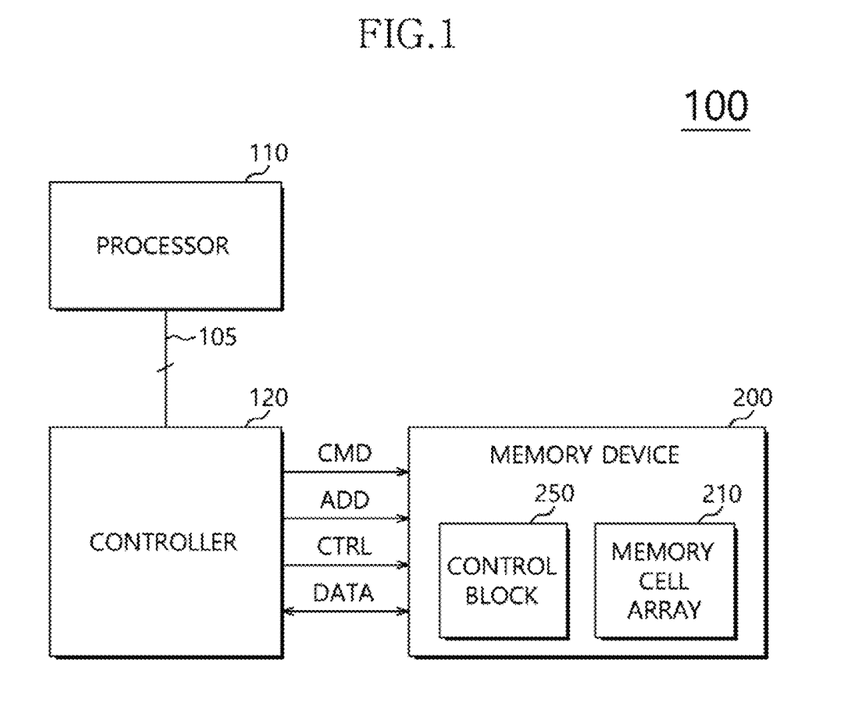
FIG. 1 is a block diagram, illustrating a semiconductor system, in accordance with example embodiments.

FIG. 1 is a block diagram, illustrating a semiconductor system, in accordance with example embodiments.

Referring to FIG. 1, a semiconductor system 100 may include a processor 110, a controller 120, and a memory device 200.

The processor 110 may be connected to the controller 105 through a bus 105. The processor 110 may provide the controller 120 with a memory access request (a read request, a write request, etc.,), including a memory address and data. The processor 110 may receive read data from the controller 120.

The controller 120 may provide the semiconductor memory device 200 with a command CMD such as a read command, a write command, etc., an address ADD, data DATA and a control signal CTRL in order to operate the semiconductor device 200.

The memory device 200 may include a non-volatile resistance variable memory device, including a variable resistive element. The variable resistive element may change the variable resistive characteristics in accordance with a current and/or a voltage to perform memory operations. For example, the variable resistive element may include a material used in an RRAM, a PRAM, an MRAM, an FRAM, etc., for example, a chalcogenide compound, a transition metal compound, ferroelectrics, a ferromagnetic substance, etc. However, the variable resistive element is not restricted to the above-mentioned materials. Particularly, the variable resistive element may include metal oxide. The metal oxide may include transition metal oxide such as nickel oxide, titanium oxide, hafnium oxide, zirconium oxide, tungsten oxide, cobalt oxide, etc., Pevroskite material such as STO (SrTiO), PCMO (PrCaMnO), etc.

The variable resistive element may include a phase changeable material. The phase changeable material may include a chalcogenide material such as GST(Ge—Sb—Te). The variable resistive element may be stabilized into any one of a crystalline state and an amorphous state by applying heat to represent a switching characteristic between different resistance states.

The variable resistive element may include a tunnel barrier layer between two magnetic layers. The magnetic layers may include NiFeCo, CoFe, etc. The tunnel barrier layer may include $Al_2O_3$, etc. The variable resistive element may represent a switching characteristic between different resistance states in accordance with magnetization directions of the magnetic layers. For example, when the magnetization directions of the magnetic layers are parallel to each other, the variable resistive element may have a low resistance state. In contrast, when the magnetization directions of the magnetic layers are not parallel to each other, the variable resistive element may have a high resistance state. Hereinafter, the memory device 200 of this example embodiment may correspond to the non-volatile resistance variable memory device. The non-volatile resistance variable memory device 200 may include a memory cell array 210 and a control block 250.

Figure 2:
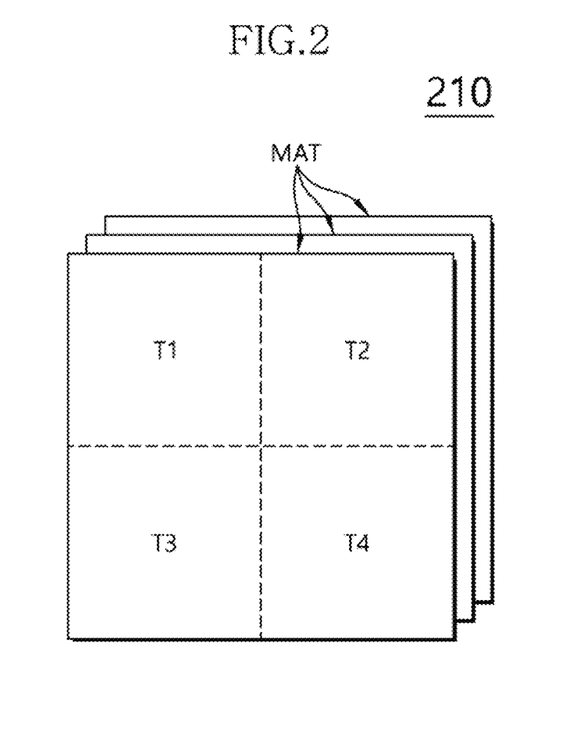
FIG. 2 is a perspective view, illustrating a memory cell array of a resistance variable memory device, in accordance with example embodiments.

FIG. 2 is a perspective view, illustrating a memory cell array of a resistance variable memory device, in accordance with example embodiments.

Referring to FIG. 2, the memory cell array 210 of the resistance variable memory device 200 may include a plurality of MATs.

Each of the MATs may be divided into a plurality of tiles T1~T4. In example embodiments, one MAT may be divided into the four tiles T1~T4. Each of the tiles T1~T4 may include a plurality of memory cells.

The control block 250 may be provided to each of the tiles T1~T4. For example, the control block 250 may be interposed between each of the tiles T1~T4 and a semiconductor substrate 300.

Figure 3:
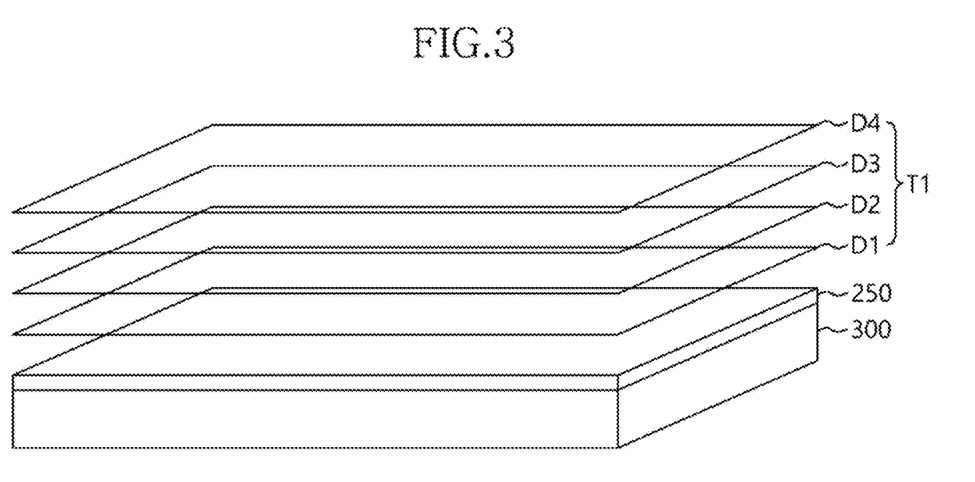
FIG. 3 is a perspective view, illustrating a tile, in accordance with example embodiments.

FIG. 3 is a perspective view, illustrating a tile, in accordance with example embodiments. The tiles T1~T4 may have substantially the same configuration. FIG. 3 shows the first tile T1 among the tiles T1~T4.

Referring to FIG. 3, the tile T1 may be disposed on the semiconductor substrate 300, the control block 250 being disposed in between tile T1 and the semiconductor 300. Tile T1 may include a plurality of stacked decks D1~D4. Each of the decks D1~D4 may have a two-dimensional arrangement with a plurality of memory cells. In example embodiments, tile T1 may include the four stacked decks D1~D4.

Figure 4:
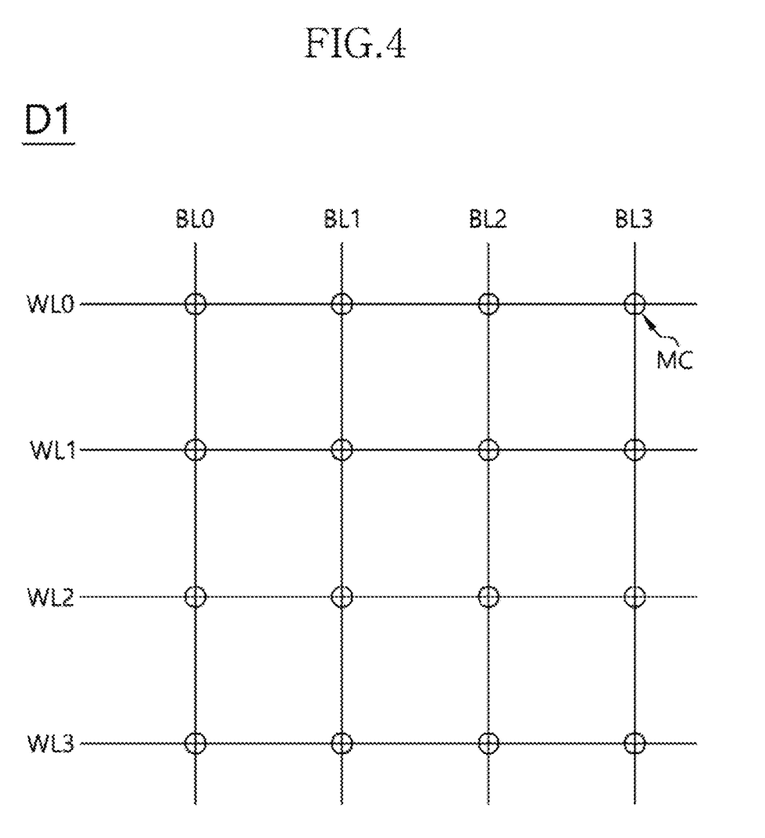
FIG. 4 is a circuit diagram, illustrating a deck, in accordance with example embodiments.

FIG. 4 is a circuit diagram, illustrating a deck, in accordance with example embodiments.

Referring to FIG. 4, deck D1 may include a plurality of word lines WL0~WL3, a plurality of bit lines BL0~BL3 and memory cells MC. Each of the decks D1~D4 may have substantially the same configuration.

The bit lines BL0~BL3 may intersect with the word lines WL0~WL3. The memory cells MC may be positioned at the intersection points of the word lines WL0~WL3 and the bit lines BL0~BL3, respectively.

Figure 5:
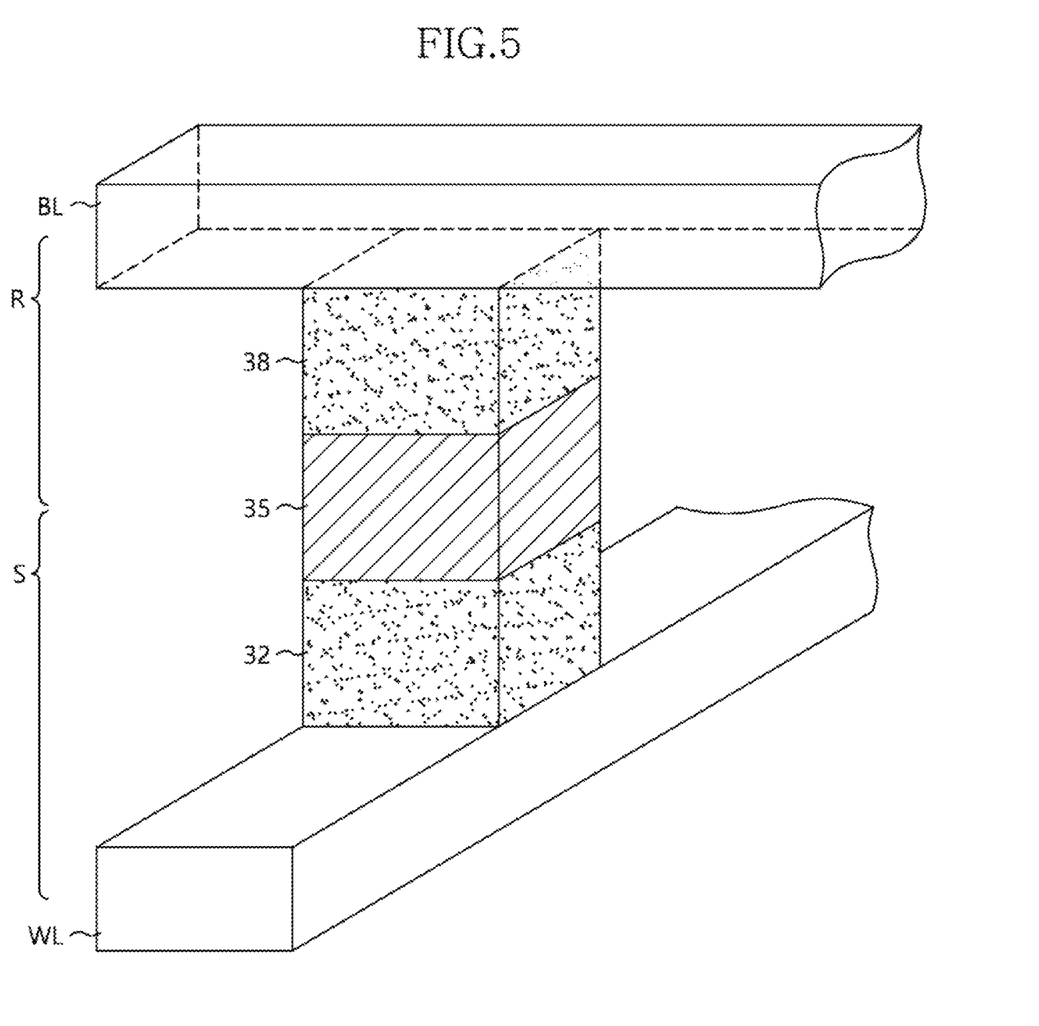
FIG. 5 is a perspective view, illustrating a memory cell, in accordance with example embodiments.

FIG. 5 is a perspective view, illustrating a memory cell, in accordance with example embodiments.

Referring to FIG. 5, the memory cells MC may include a selector 32, a middle electrode 35, and a storage layer 38, positioned on the intersection point of the word line WL and the bit line BL. The selector 32, the middle electrode 35, and the storage layer 38 may be sequentially stacked at the intersection point between the word line WL and the bit line BL.

At least one of the selector 32 and the storage layer 38 may include a chalcogenide material as a phase changeable material. When the storage layer 38 includes the chalcogenide material, the chalcogenide material of the storage layer 38 may have a non-volatile phase change at room temperature. In contrast, the chalcogenide material of the selector 32 may have phase change characteristics different from that of the chalcogenide material in the storage layer 38. Positions of the selector 32 and the storage layer 38 may be flipped, depending on the embodiment.

The selector 32 may be an OTS (Ovonic threshold switch) element, including an OTS material. The OST material may include the chalcogenide materials, which the storage layer 38 is composed of. However, the selector 32 may further include an element for suppressing crystallization, such as arsenic (As). The element may prohibit a non-temporary nucleus formation and prohibit the growth of the chalcogenide material, thereby suppressing the crystallization effect. Thus, when an electric potential, above a critical voltage, is applied, the selector 32 may be switched into a conductive state. A sufficient current may be provided to the selector 32 during the conductive state. For example, the selector 32 may include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, Ge—As—Bi—Se, etc. The word line WL may be used as a heating electrode for heating the selector 32.

The storage layer 38, i.e., the phase changeable memory layer may include elements in an In—Sb—Te (IST) alloy system. For example, the phase changeable memory layer may include at least two of $In_2Sb_2Te_5$, $In_1Sb_2Te_4$ and $In_1Sb_4Te_7$, elements in a Ge—Sb—Te (GST) alloy system. In another embodiment, the phase changeable memory layer may include at least two of $Ge_8Sb_5Te_8$, $Ge_2Sb_2Te_5$, $Ge_1Sb_2Te_4$, $Ge_1Sb_4Te_7$ and $Ge_4Sb_4Te_7$, etc. Here, the chemical composition notations, using the hyphens, may represent elements in a specific mixture or compound and all of the stoichiometry incidental to the elements. The chalcogenide alloy of the storage layer 38 may include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, etc.

The middle electrode 35 may be a node for electrically connecting the selector 32 with the storage layer 38. The middle electrode 35 may be used as a heating electrode for heating the storage layer 38.

For example, the word line WL, the selector 32 and the middle electrode 35 may form an access element S of the memory cell MC. The middle electrode 35, the storage layer 38 and the bit line BL may form a variable resistance R of the memory cell MC.

In example embodiments, the stacked decks D1~D4 may commonly share the word line WL or the bit line BL. For example, the first deck D1 and the second deck D2 may commonly share the bit line BL. The second deck D2 and the third deck D3 may commonly share the word line WL. The third deck D3 and the fourth deck D4 may commonly share the bit line BL.

Figure 6:
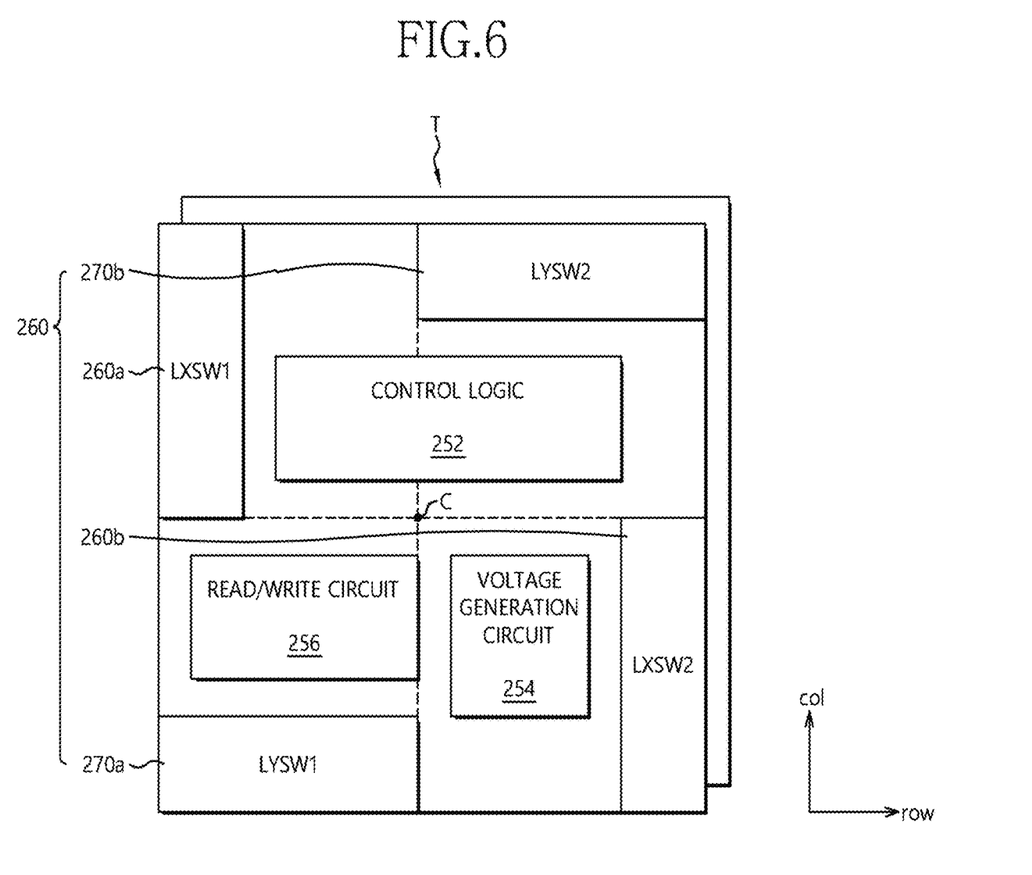
FIG. 6 is a plan view, illustrating a control block, in accordance with example embodiments.

FIG. 6 is a plan view, illustrating a control block, in accordance with example embodiments.

Referring to FIG. 6, the control block 250 may be arranged between the semiconductor substrate 300 and tile T1, as mentioned above. The control block 250 may include transistors for forming a plurality of control circuits.

For example, the control block 250 may include a control logic 252, a voltage generation circuit 254, a read/write circuit 256 and a decoding circuit 260.

The control logic 252 may generate control signals for writing data DATA into the stacked decks D1~D4 or for reading data DATA based on the command CMD, the address ADD, and the control signal CTRL, received from the memory controller 120. The control signals may be provided to the voltage generation circuit 254, the read/write circuit 256, and the decoding circuit 260. The control logic 252 may provide the read/write circuit 256 with operation control signals for operating the read/write circuit 256. For example, the operation control signals may include a write enable signal, a read enable signal, a sensing enable signal, a discharge enable signal, a pre-charge enable signal, etc. The control logic 252 may provide the voltage generation circuit 254 with a voltage generation signal.

The voltage generation circuit 254 may generate voltages for performing a write operation, a read operation, and an erase operation on the memory cell array 210. Particularly, the voltage generation circuit 254 may generate a word line drive voltage $V_{WL}$ to drive the word lines and a bit line drive voltage $V_{BA}$ to drive the bit lines. The word line drive voltage $V_{WL}$ and the bit line drive voltage $V_{BA}$ may include a reset write voltage, a set write voltage, an inhibit voltage, a read voltage, a verify voltage, etc.

The decoding circuit 260 may include row switching units 260a and 260b and column switching units 270a and 270b. The row switching units 260a and 260b may select a word line of a selected row in tile T in response to a row address. The column switching units 270a and 270b may select a bit line of a selected column in tile T in response to a column address.

The row switching units 260a and 260b may be classified as a first row switching unit 260a and a second row switching unit 260b, in accordance with their positions. Thus, the word lines may be divided and controlled by the first and second row switching units 260a and 260b. For example, the first row switching unit 260a and the second row switching unit 260b may be arranged on a diagonal line crossing a center point c of tile T. For example, when tile T is divided into first to fourth quadrants, the first row switching unit 260a may be positioned at an outer edge portion of the first quadrant and the second row switching unit 260b may be positioned at an outer edge portion of the fourth quadrant, in such a way that all of the word lines may be connected to either the first row switching unit 260a or the second row switching unit 260b.

The column switching units 270a and 270b may be classified as a first column switching unit 270a and a second column switching unit 270b, in accordance with positions. Thus, the bit lines may be divided and controlled by the first and second column switching units 270a and 270b. For example, the first column switching unit 270a and the second column switching unit 270b may be arranged on the diagonal line crossing the center point c of tile T. For example, the first column switching unit 270a may be positioned at an outer edge portion of the second quadrant and the second column switching unit 270b may be positioned at an outer edge portion of the third quadrant, in such a way that all of the bit lines may be connected to either the first column switching unit 270a or the second column switching unit 270b.

For example, when one tile T includes n numbers of rows, the word lines, positioned at the first to n/2 rows, may be connected to the first row switching unit 260a. Here, the first row switching unit 260a may include switching transistors (row switching transistors), arranged at one edge portion of each of the first to n/2 rows (upper rows), for example, the edge portion of the first quadrants. For example, one portion of the word lines, positioned at the first to n/2 rows, may be connected to the row switching transistor positioned at an edge portion of a corresponding row. Another portion of the word lines positioned at the first to n/2 rows, for example, of tile T2 in FIG. 7, may be connected to the row switching transistor positioned at a corresponding row of another tile. Another embodiment may disclose a configuration that is flipped in a way that the first row switching unit 260a may be arranged at an edge portion of the second quadrants.

The word lines, positioned at the (n+1)/2 to n rows (lower rows), may be connected to the second row switching unit 260b. Here, the second row switching unit 260b may include the row switching transistor, s arranged at the other edge portion of each of the (n+1)/2 to n rows, for example, the edge portion of the fourth quadrants. For example, one portion of the word lines positioned at the (n+1)/2 to n rows may be connected to the row switching transistor positioned at an edge portion of a corresponding row. Another portion of the word lines positioned at the (n+1)/2 to n rows, for example, of tile T2 in FIG. 7, may be connected to the row switching transistor positioned at a corresponding row of another tile. Another embodiment may disclose a configuration that is flipped in a way that the second row switching unit 260b may be arranged at an edge portion of the third quadrants.

Additionally, when one tile T includes m number of columns, the bit lines, positioned at the first to m/2 columns (left columns), may be connected to the first column switching unit 270a. Here, the first column switching unit 270a may include switching transistors (column switching transistors), arranged at one edge portion of each of the first to m/2 columns, for example, the edge portion of the second quadrants. For example, one portion of the bit lines positioned at the first to m/2 columns may be connected to the column switching transistor positioned at a corresponding column. Another portion of the bit lines positioned at the first to m/2 columns, for example, of tile T3 in FIG. 7, may be connected to the column switching transistor positioned at a corresponding column of another tile. Another embodiment may disclose a configuration that is flipped in a way that the first column switching unit 270a may be arranged at an edge portion of the first quadrants.

The bit lines, positioned at the (m+1)/2 to m columns (right columns), may be connected to the second column switching unit 270b. Here, the second column switching unit 270b may include the column switching transistors, arranged at the other edge portion of each of the (m+1)/2 to m columns, for example, the edge portion of the third quadrants. For example, one portion of the bit lines positioned at the (m+1)/2 to m columns may be connected to the column switching transistor positioned at an edge portion of a corresponding column. Another portion of the bit lines positioned at the (m+1)/2 to m columns, for example, of tile T3 in FIG. 7, may be connected to the column switching transistor positioned at a corresponding column of another tile. Another embodiment may disclose a configuration that is flipped in a way that the second column switching unit 270b may be arranged at an edge portion of the fourth quadrants.

U.S. 2018/0358085 may disclose relations between the row switching transistor, the column switching transistor and the memory cell, the disclosure of which is hereby incorporated by reference in its entirety.

In another embodiment, a row switching unit and a column switching unit of a general resistance variable memory device may be positioned in an area between tiles T. For example, the row switches 260a and 260b and the column switches 270a and 270b may be arranged at the overlapped positions with the decks in tile T. Therefore, when a gap between the tiles T are set, it may not be required to consider areas of the row switching units 260a and 260b and the column switching units 270a and 270b. As a result, an area of tile T may be expanded by a reduced gap between tiles T.

Additionally, in example embodiments, the circuits 252, 254, and 256 in the control block 250 may be provided to each of the tiles. Alternatively, the control logic 252, the voltage generation circuit 254 and the read/write circuit 256 of the control block 250 may be arranged at any one of the tiles T1~T4 to provide the remaining tiles with the signal/voltage.

Figure 7:
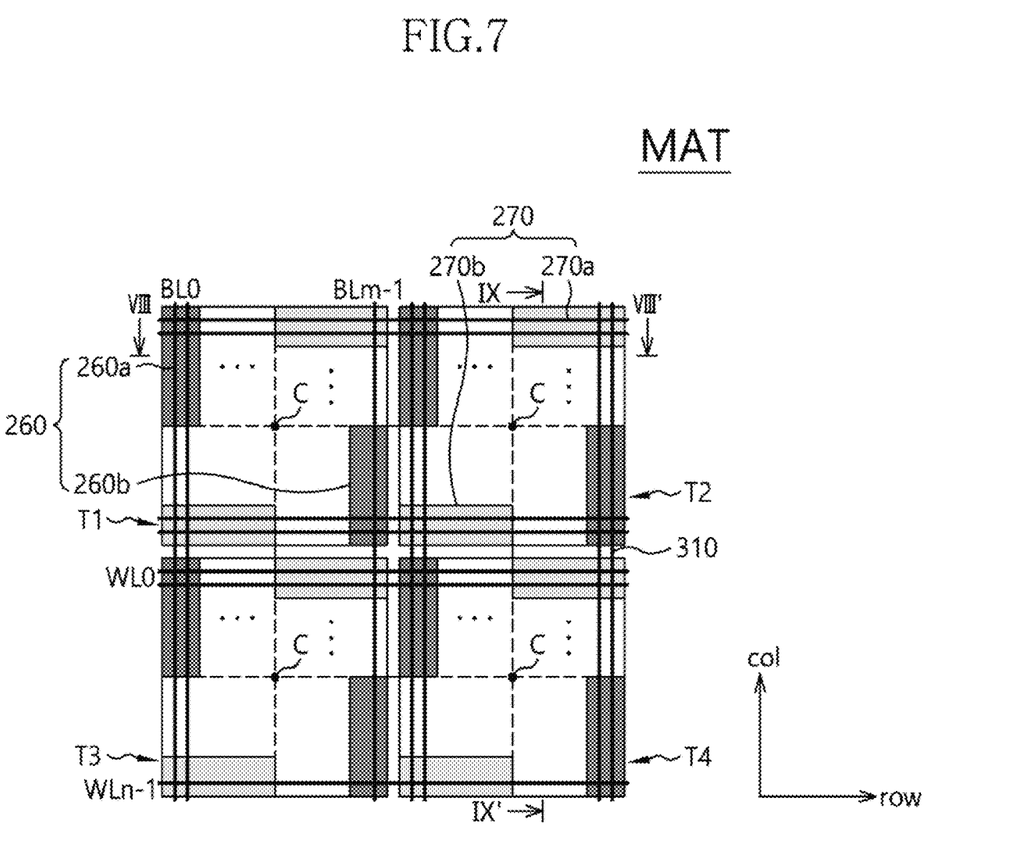
FIG. 7 is a plan view illustrating a memory array tile (MAT), including a plurality of tiles, in accordance with example embodiments.
Figure 8:
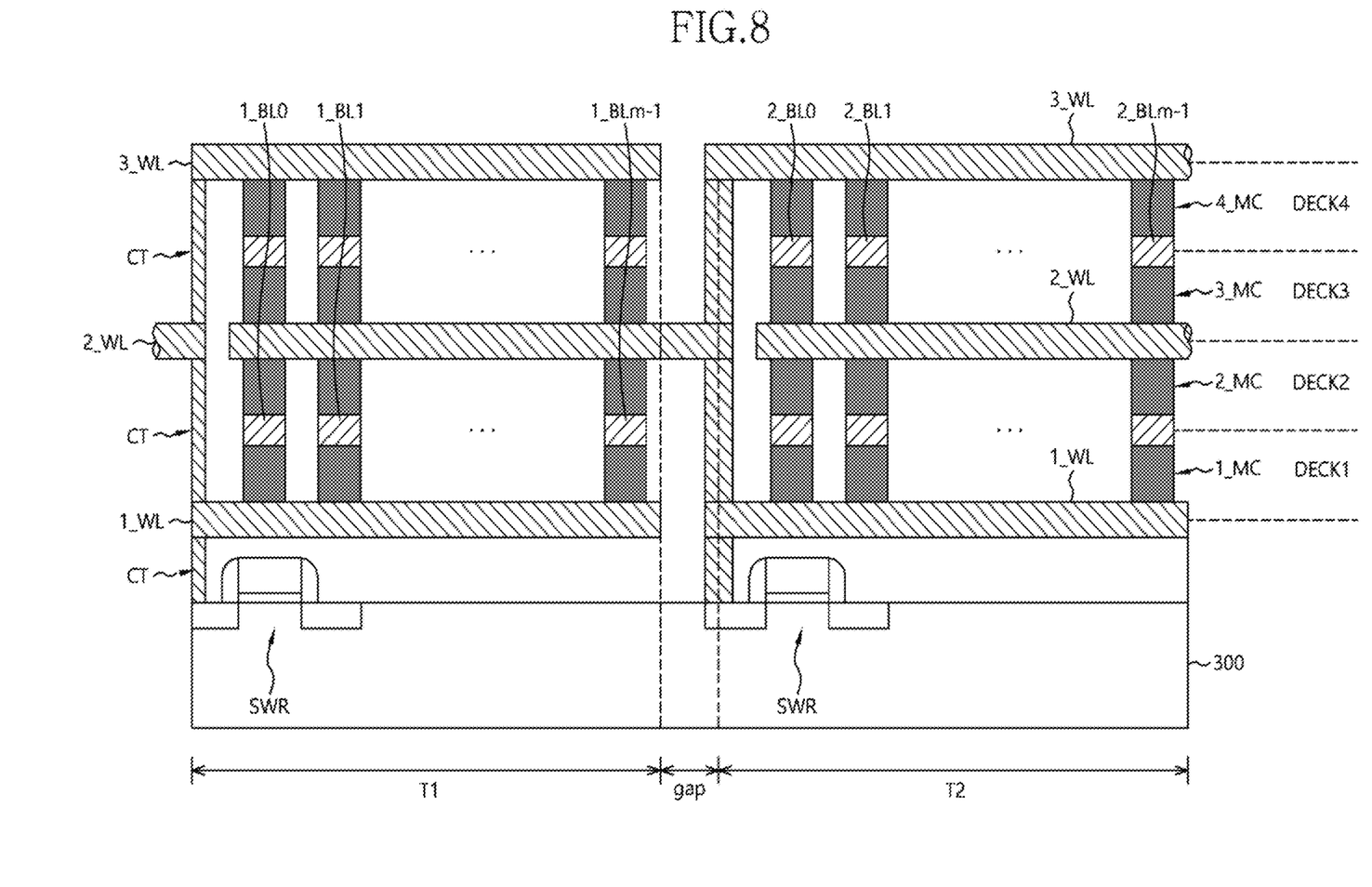
FIG. 8 is a cross-sectional view taken along a line VIII-VIII' in FIG. 7.

FIG. 7 is a plan view illustrating a MAT, including a plurality of tiles, in accordance with example embodiments. FIG. 8 is a cross-sectional view, taken along a line VIII-VIII' in FIG. 7. Furthermore, FIG. 9 is a cross-sectional view, taken along a line IX-IX' in FIG. 7.

Figure 9:
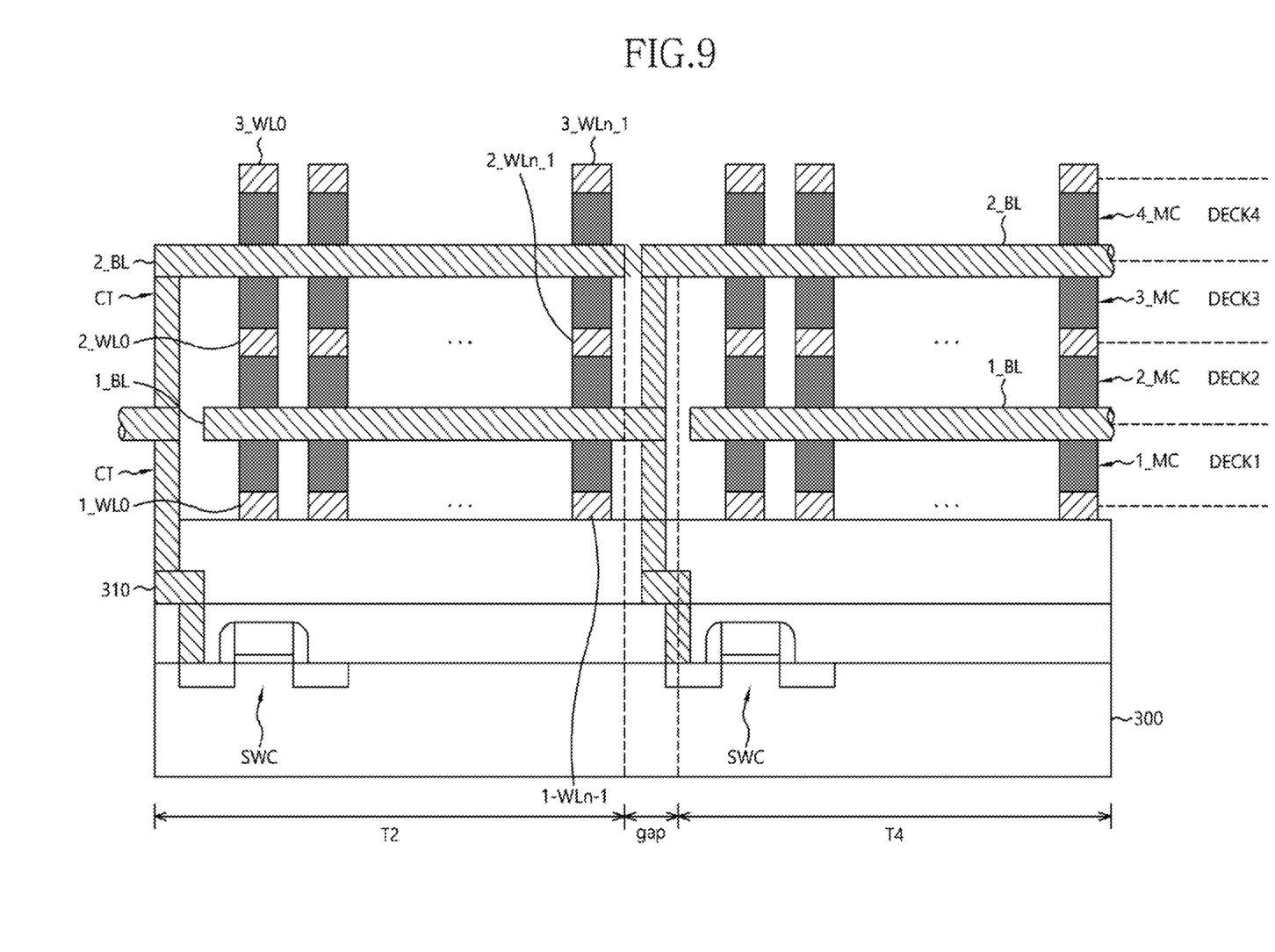
FIG. 9 is a cross-sectional view taken along a line IX-IX' in FIG. 7.

Referring to FIGS. 7 to 9, the semiconductor substrate 300 may include a region where at least one MAT may be to be formed. The MAT may be divided into the tiles where the memory cell may be formed. In example embodiments, one MAT may be divided into four tiles T1~T4.

As mentioned above, the gap between the conventional tiles may be set, considering the area of the row switching units (ex. row decoder) or the column switching units (ex. column decoder).

In example embodiments, the row switching units 260a and 260b and the column switching units 270a and 270b are arranged under the tiles T1~T4, except for the contact portions that connect the row switching units 260a, 260b and the word lines and connect the column switching units 270a, 270b and the bit lines. Since conventional contact portions may have a minimum feature size, the gap between the tiles T1~T4 may be reduced to a size slightly (for example, 10%~20%) larger than the minimum feature size.

The row switching transistors SWR of the first and second row switching units 260a and 260b and the column switching transistors SWC of the first and second column switching units 270a and 270b may be formed on the semiconductor substrate 300 with the tiles T1~T4. The row switching transistors SWR may be arranged on the tiles T1~T4 for each row. The row switching transistors SWR may be arranged at one end or the other end of the tile in accordance with the position of the row.

The column switching transistors SWC may be arranged on the tiles T1~T4 for each column. The column switching transistors SWC may be arranged at an upper end or the lower end of the tile in accordance with the position of the column.

For example, an arrangement direction of the row switching transistors SWR may be substantially perpendicular to an arrangement direction of the column switching transistors SWC.

As it is well known, since the row switching transistor SWR and the column switching transistor SWC may include a junction region, the junction region may partially diffuse into the gap between the tiles.

In example embodiments, auxiliary bit line pads 310 may be arranged for each column of the tiles T1~T4, for connecting the column switching transistors and the bit lines. For example, the auxiliary bit line pads 310 may be positioned over the column switching transistors SWC of each of the tiles T1~T4. For example, the auxiliary bit line pads 310 may be electrically connected with a drain of each of the column switching transistors SWC. In order to readily contact the auxiliary bit line pads 310 with bit lines, the auxiliary bit line pads 310 may be extended from the drain of the column switching transistor SWC to the gap of the tile adjacent to an extending direction of the bit line. For example, at least one insulation layer may be interposed between the semiconductor substrate 300, with the row and column switching transistors SWR and SWC, and the auxiliary bit line pads 310.

The first level of word lines 1_WL0~1_WLn−1 (1_WL of FIG. 8) may be arranged on the auxiliary bit line pads 310. The first level of the word lines 1_WL0~1_WLn−1 (1_WL of FIG. 8) may be arranged, on each of the tiles T1~T4, along an x-direction (row direction) in FIG. 7. The first level of the word lines 1_WL0~1_WLn−1 (1_WL of FIG. 8) and the auxiliary bit line pad 310 are insulated by an insulation layer. The insulation layer may function as a planarization layer. Thus, the first level of the word lines 1_WL0~1_WLn−1 (1_WL of FIG. 8) may be arranged on a flat upper surface of the insulation layer. The first level of the word lines 1_WL0~1_WLn−1 (1_WL of FIG. 8) may be electrically connected with the drain of the row switching transistor SWR positioned at the same row of the corresponding tile as shown in FIG. 8.

The first level of bit lines 1_BL0~1_BLm−1 (1_BL of FIG. 9) may be arranged and stacked on the first level of the word lines 1_WL0~1_WLn−1 (1_WL of FIG. 8). The first level of bit lines 1_BL0~1_BLm−1 (1_BL of FIG. 9) may be extended by each of the tiles T1~T4 along a y-direction (column direction) in FIG. 7, to be intersected the word lines 1_WL0~1_WLn−1 (1_WL of FIG. 8). First level of memory cells 1_MC may be arranged at intersected portions between the first level of the word lines 1_WL0~1_WLn−1 (1_WL of FIG. 8) and the first level of bit lines 1_BL0~1_BLm−1 (1_BL of FIG. 9). Each of the memory cells MC may have the configuration in FIG. 5. Thus, the first deck DECK1 may be formed by the first level of the word lines 1_WL0~1_WLn−1 (1_WL of FIG. 8), the first level of bit lines 1_BL0~1_BLm−1 (1_BL of FIG. 9) and the first level of memory cells 1_MC. Although not depicted in drawings, an insulation layer may be interposed between the first level of the word lines 1_WL0~1_WLn−1 (1_WL of FIG. 8) and the first level of bit lines 1_BL0~1_BLm−1 (1_BL of FIG. 9), i.e., between the first level of the memory cells 1_MC.

Second level of word lines 2_WL0~2_WLn−1 (2_WL of FIG. 8) may be arranged and stacked on the first level of the bit lines 1_BL0~1_BLn−1(1_BL of FIG. 9). The second level of word lines 2_WL0~2_WLn−1 (2_WL of FIG. 8) may be intersected with the first level of bit lines 1_BL0~1_BLm−1(1_BL of FIG. 9). Second level of memory cells 2_MC may be formed at intersected portions between the first level of the bit lines 1_BL0~1_BLm−1 (1_BL of FIG. 9) and the second level of word lines 2_WL0~2_WLn−1 (2_WL of FIG. 8). Thus, the second deck DECK2 may be formed by the the first level of the bit lines 1_BL0~1_BLm−1 (1_BL of FIG. 9), the second level of word lines 2_WL0~2_WLn−1 (2_WL of FIG. 8) and the second level of memory cells 2_MC. An insulation layer may be interposed between the first level of the bit lines 1_BL0~1_BLm−1 (1_BL of FIG. 9) and the second level of word lines 2_WL0~2_WLn−1 (2_WL of FIG. 8), i.e., between the second level of the memory cells 2_MC.

For example, the second level of the memory cells 2_MC, the first level of the bit lines 1_BL0~1_BLm−1 (1_BL of FIG. 9) and the first level of the memory cells 1_MC are positioned between the first level of the word lines 1_WL0~1_WLn-1 (1_WL of FIG. 8) and the second level of word lines 2_WL0~2_WLn-1 (2_WL of FIG. 8).

Second level of bit lines 2_BL0~2_BLm-1 (2_BL of FIG. 9) may be arranged and stacked on the second level of the word lines 2_WL0~2_WLn-1 (2_WL of FIG. 8). The second level of bit lines 2_BL0~2_BLm-1 (2_BL of FIG. 9) may be intersected with the second level of word lines 2_WL0~2_WLn-1 (2_WL of FIG. 8). Third level of memory cells 3_MC may be arranged at intersected portions between the second level of the bit lines 2_BL0~2_BLm-1 (2_BL of FIG. 9) and the second level of word lines 2_WL0~2_WLn-1 (2_WL of FIG. 8) to define the third deck DECK3. For example, the third deck DECK 3 may include the second level of bit lines 2_BL0~2_BLm-1 (2_BL of FIG. 9), the second level of the word lines 2_WL0~2_WLn-1 (2_WL of FIG. 8) and the third level of memory cells 3_MC. An insulation layer may be interposed between the second level of the bit lines 2_BL0~2_BLm-1 (2_BL of FIG. 9) and the second level of word lines 2_WL0~2_WLn-1 (2_WL of FIG. 8), i.e., between the third level of the memory cells 3_MC. The third level of the memory cells 3_MC, the second level of the word lines 2_WL0~2_WLn-1 (2_WL of FIG. 8) and the second level of the memory cells 2_MC are positioned between the first level of the bit lines 1_BL0~1_BLm-1 (1_BL of FIG. 9) and the second level of bit lines 2_BL0~2_BLm-1 (2_BL of FIG. 9).

Third level of word lines 3_WL0~3_WLn-1 (3_WL of FIG. 8) may be arranged and stacked on the second level of the bit lines 2_BL0~2_BLm-1 (2_BL of FIG. 9). The third level of word lines 3_WL0~3_WLn-1 (3_WL of FIG. 8) may be intersected with the second level of bit lines 2_BL0~2_BLm-1 (2_BL of FIG. 9). Fourth level of memory cells 4_MC may be arranged at intersected portions between the second level of the bit lines 2_BL0~2_BLm-1 (2_BL of FIG. 9) and the third level of word lines 3_WL0~3_WLn-1 (3_WL of FIG. 8) to define the fourth deck DECK4. The fourth deck DECK 4 may include the third level of word lines 3_WL0~3_WLn-1 (3_WL of FIG. 8), the second level of the bit lines 2_BL0~2_BLm-1 (2_BL of FIG. 9) and the fourth level of memory cells 4_MC. An insulation layer may be interposed between the second level of the bit lines 2_BL0~2_BLm-1 (2_BL of FIG. 9) and the third level of word lines 3_WL0~3_WLn-1 (3_WL of FIG. 8), i.e., between the fourth level of the memory cells 4_MC. The fourth level of the memory cells 4_MC, the second level of the bit lines 2_BL0~2_BLm-1 (2_BL of FIG. 9) and the third level of the memory cells 3_MC are positioned between The third level of the word lines 3_WL0~3_WLn-1 (3_WL of FIG. 8) and the second level of word lines 2_WL0~2_WLn-1 (2_WL of FIG. 8).

According to the example embodiments, a tile may include four decks, i.e., the four layered memory cell array. A deck may commonly share a word line and a bit line of a deck over or under the corresponding deck.

For example, referring to FIG. 8, one end of the first level of the word lines 1_WL (and 1_WL0~1_WLn-1 of FIG. 9) and one end of the third level of the word lines 3_WL (and 3_WL0~3_WLn-1 of FIG. 9) at a selected row of a selected tile T1 may be connected with the row switching transistor SWR at the selected row through a contact CT. The one ends of the first level of the word lines 1_WL (and 1_WL0~1_WLn-1 of FIG. 9) and the third level of the word lines 3_WL (and 3_WL0~3_WLn-1 of FIG. 9) may be positioned adjacent to the row switching transistor SWR.

The second level of the word line 2_WL, at the selected row of the selected tile T1, may be connected to the row switching transistor SWR of a corresponding row in another tile T2, adjacent to an extending direction of the word line. For example, the other end of the second level of the word line 2_WL at the selected row of the selected tile T1 may be electrically connected to the row switching transistor SWR for controlling the selected row of the adjacent tile T2. The other end of the second level of the word line 2_WL, of the selected tile T1, might not be electronically connected to the row switching transistor SWR of the selected tile T1. Thus, the first level of the word line 1_WL and the third level of the word line 3_WL, at the selected tile T1, may be driven by the row switching transistors SWR of the selected tile T1. In contrast, the second level of the word line 2_WL, of the selected tile T1, may be driven by the row switching transistors SWR of another tile T2 adjacent to the selected tile T1.

The row switching transistor SWR of the selected tile T1 and the first level of the word line 1_WL may be electrically connected by at least one contact CT. The first level of the word line 1_WL of the selected tile T1 and the second level of the word line 2_WL of the adjacent tile (not shown in FIG. 8) may be electrically connected by at least one contact CT. The second level of the word line 2_WL of the adjacent tile and the third level of the word line 3_WL of the selected tile T1 may be electrically connected by at least one contact CT. FIG. 8 shows the contacts CT, positioned at the ends of the first to third levels of the word lines 1_WL, 2_WL and 3_WL. However, the contacts CT may be located at other positions of the first to third levels of the word lines 1_WL, 2_WL and 3_WL.

For example, the first to third levels of the word lines 1_WL, 2_WL and 3_WL may have substantially the same length for crossing over the corresponding tile. However, in another embodiment, in order to readily connect the first to third levels of the word lines 1_WL, 2_WL and 3_WL with the row switching transistor SWR, the first to third levels of the word lines 1_WL, 2_WL and 3_WL may have different lengths. For example, because the second level of the word line 2_WL of the selected tile T1 may be connected with the row switching transistor SWR and the first and third levels of the word lines 1_WL and 3_WL of the second tile T2, the second level of the word line 2_WL of the first tile T1 may be drawn out toward the second tile T2 (or adjacent tile), penetrating the gap between the first and second tiles T1 and T2.

Referring to FIG. 9, the second level of the bit line 2_BL, or an uppermost bit line positioned at the selected column of a selected tile T4, may be electrically connected to the column switching transistor SWC at the selected column through the auxiliary bit line pad 310 and contacts CTs. The auxiliary bit line pad 310 may readily connect the end of the second level of the bit line 2_BL through the gap between tiles T2 and T4 with the column switching transistor SWC in tile T4.

The second level of the bit line 2_BL, at the selected column of the selected tile T4, may be electrically connected to the first level of the bit line 1_BL of the corresponding column of tile T2, adjacent to the selected tile T4. Tile T2, adjacent to the selected tile T4, may correspond to a tile, which may be among the tiles adjacent to the extending direction of the bit line, positioned adjacent to the column switching transistor SWC of the selected tile T4. Thus, the first level of the bit line 1_BL, of the selected tile t4, may be controlled by the column switching transistor SWC of the adjacent tile (not shown) and the second level of the bit line 2_BL of the selected tile t4 may be controlled by the column switching transistor SWC of the selected tile T4.

The column switching transistor SWC of the selected tile T4 and the first level of the bit line 1_BL of the adjacent tile may be connected by at least one contact CT. The first level of the bit line 1_BL of the adjacent tile and the second level of the bit line 2_BL of the selected tile T4 may be electrically connected by at least one contact CT.

The first and second levels of the bit lines 1_BL and 2_BL may have substantially the same length for crossing over the corresponding tile. However, in another embodiment, in order to readily connect the bit line with the column switching transistor SWC, the first and second levels of the bit lines 1_BL and 2_BL may have different lengths. For example, because the first level of the bit line 1_BL of the second tile T2 may be connected with the column switching transistor SWC of the fourth tile T4 and the second level of the bit line 2_BL of the fourth tile T4, the first level of the bit line 1_BL of the second tile T2 may be drawn out toward the fourth tile T4, penetrating the gap between the second and fourth tiles T2 and T4.

Hereinafter, operations of the resistance variable memory device may be illustrated in detail.

When the first row of the second tile T2 is selected, the row switching transistor SWR corresponding to the first row may be driven in accordance with the corresponding row address. Thus, the first level of the word line 1_WL at the first row of the second tile T2, the third level of the word line 3_WL at the first row of the second tile T2, and the second level of the word line 2_WL at the first row of the first tile T1, connected with the row switching transistor SWR at the first row, may be simultaneously enabled.

When a write voltage or a read voltage is applied to select the bit line of the first column of the second tile T2, the column switching transistor SWC at the first column may be driven. Thus, the write voltage or the read voltage may be transmitted to the second level of the bit line 2_BL of the second tile T2 connected to the column switching transistor SWC at the first column and the first level of the bit line 1_BL at the first column of the fourth tile T4.

Although the two word lines of one tile may be simultaneously selected, one memory cell of one tile may be selected because only one bit line of one tile may be enabled.

Figure 10:
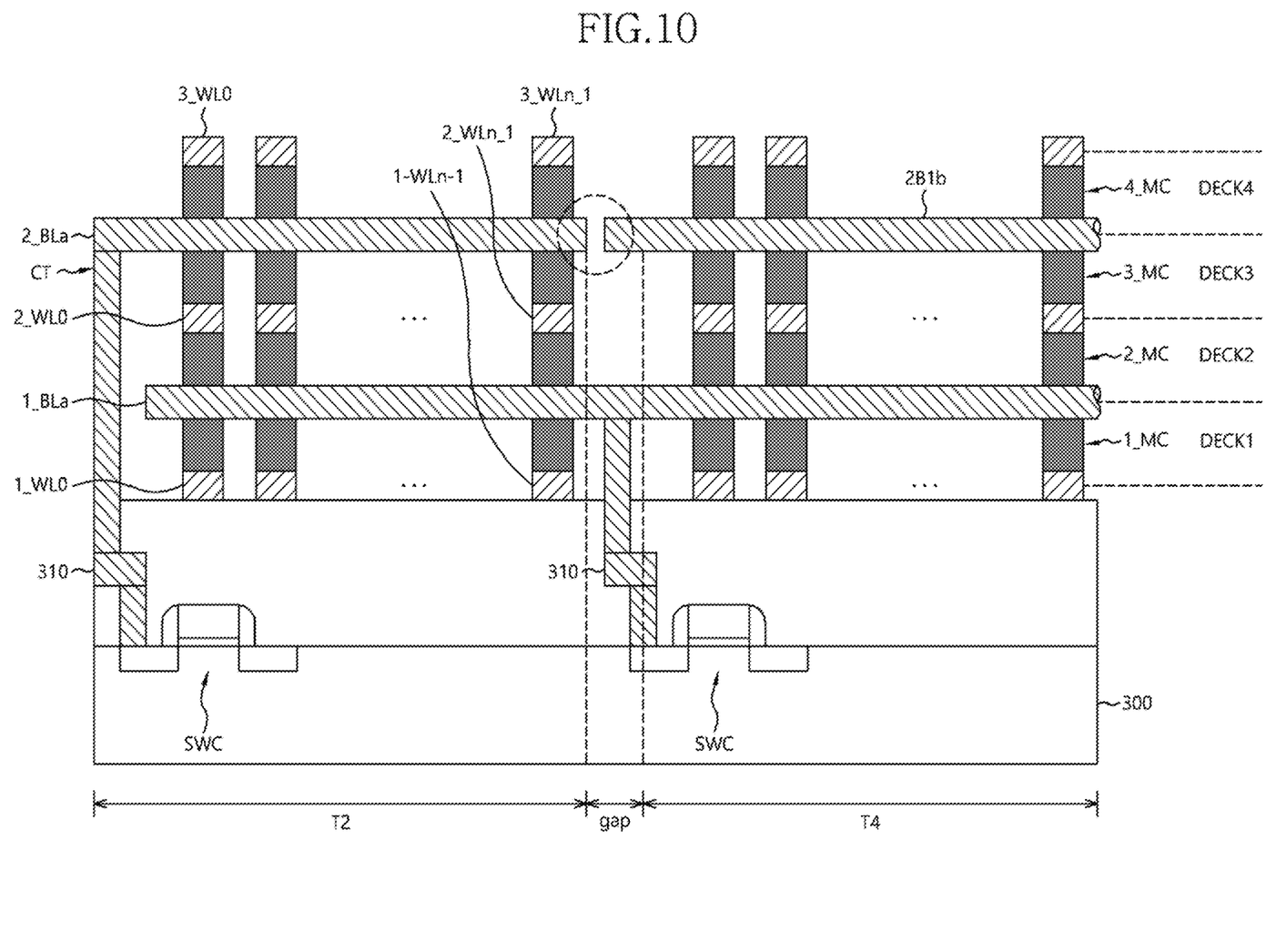
FIG. 10 is a cross-sectional view, illustrating an arrangement of bit lines, in accordance with example embodiments.

FIG. 10 is a cross-sectional view, illustrating an arrangement of bit lines, in accordance with example embodiments. Formations of word lines and bit lines of this example embodiment may be substantially the same as those illustrated previously. Thus, any further illustrations with respect to the formations of the word lines and the bit lines may be omitted herein for brevity. Here, a shape of the bit line may be illustrated.

Referring to FIG. 10, a first level of a bit line 1_BLa and a second level of a bit line 2_BLa and 2_BLb may be configured to cross over the two tiles without disconnections. The first level of the bit line 1_BLa and the second level of the bit line 2_BLa and 2_BLb, crossing over the two tiles, may overlap with each other in only one tile. The first and second levels of the bit lines 1_BLa, 2_BLa and 2_BLb are extended by a unit of the two tiles without a disconnection. Thus, the first and second levels of the bit lines 1_BLa, 2_BLa and 2_BLb are arranged in a stagger shape to be overlapped with each other on the selected tile.

For example, the first level of the bit line 1_BLa of the selected column may be arranged on the fourth tile T4, which may be positioned at a first side portion of the second and fourth tiles T2 and T4 without the disconnection. The fourth tile T4 may be positioned, adjacent to the second tile T2, in the extending direction of the bit line. The first level of the bit line 1_BLa may be electrically connected with the column switching transistor SWC, positioned at a central portion of the second and fourth tiles T2 and T4, for example, the column switching transistor SWC of the fourth tile T4 via the auxiliary bit line pad 310.

The second level of the bit line 2_BLa may be arranged on the second tile T2 and a tile outside the second tile T2 (hereinafter, referred to as a first side tile) without the disconnection. The first side tile may be positioned, adjacent to the second tile T2, in the extending direction of the bit line. The second level of the bit line 2_BLa may be electrically connected with the column switching transistor SWC of the second tile T2, positioned at a central portion of the second tile T2 and the first side tile, via the auxiliary bit line pad 310.

The second level of the bit line 2_BLb may be arranged on the fourth tile T4 and a tile outside the fourth tile T4 (hereinafter, referred to as a second side tile) without the disconnection. The second side tile may be positioned adjacent to the fourth tile T4 in the extending direction of the bit line. The second level of the bit line 2_BLb may be electrically connected with the column switching transistor SWC of the fourth tile T4, positioned at a central portion of the fourth tile T4 and the second side tile, via the auxiliary bit line pad 310.

According to example embodiments, although the first and second levels of the bit lines on one tile may be arranged by a unit of the two tiles, one memory cell by one tile may be selected because the first and second levels of the bit lines may be controlled by the different column switching transistors.

Further, the row switch and the column switch may be arranged in the tile so that the gap between the tiles may be reduced. The auxiliary bit line pad may be formed between the column switch and the first level of the word line to ensure a contact margin between the column switch and the bit line.

Furthermore, the word lines and the bit lines in each of the decks may be independently controlled by the control block of the corresponding tile and the control blocks of the adjacent tiles.

Therefore, when the row address and the column address are inputted into each of the MATs, one memory cell by the tile may be selected.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A resistance variable memory device comprising:
a plurality of tiles in which memory cells are arranged;
first to third levels of word lines sequentially stacked on each of the plurality of tiles along rows of each of the tiles;
a first level of bit lines interposed between the first and second levels of the word lines, extending along columns of each of the tiles; and
a second level of bit lines interposed between the second and third levels of the word lines, extending along the columns of each of the tiles, wherein the first and third levels of the word lines of a selected row of a selected tile and the second level of the bit lines of a selected column of the selected tile are controlled by a decoding circuit of the selected tile, and wherein the second level of the word line of the selected row and the first level of the bit line of the selected column in the selected tile are controlled by another decoding circuit of another tile.

2. The resistance variable memory device of claim 1, wherein the memory cells are disposed at an intersected portion between the first level of the word lines and the first level of the bit lines, an intersected portion between the first level of the bit lines and the second level of the word lines, an intersected portion between the second level of the word lines and the second level of the bit lines, and an intersected portion between the second level of the bit lines and the third level of the word lines.

3. The resistance variable memory device of claim 1, wherein the decoding circuit comprises:
  a row switching unit including a plurality of row switching transistors connected to each of the rows, wherein each of the plurality of row switching units are configured to be connected to a different set of word lines in such a way that all word lines are connected to one of the plurality of row switching units; and
  a column switching unit including column switching transistors connected to each of the columns, wherein each of the plurality of column switching units are configured to be connected to a different set of bit lines in such a way that all bit lines are connected to one of the plurality of column switching units.

4. The resistance variable memory device of claim 1, wherein the decoding circuit comprises:
  a first row switching unit for controlling upper rows among the rows; and
  a second row switching unit for controlling lower rows among the rows,
  wherein the first row switching unit is arranged at one end of each of the upper rows, and the second row switching unit is arranged at the other end of each of the lower rows.

5. The resistance variable memory device of claim 4, wherein the first row switching unit includes row switching transistors arranged at one end of each of the upper rows, and the second row switching unit includes row switching transistors arranged at the other end of each of the lower rows.

6. The resistance variable memory device of claim 4, wherein the first and third levels of the word lines positioned at the selected row of the selected tile are commonly connected with the second level of the word line, positioned at the selected row of a tile adjacent to the selected tile, and the first or the second row switching unit of the selected tile,
  is the second level of the word line positioned at the selected row of the selected tile is commonly connected with the first and third levels of the word lines, positioned at the selected row of a tile adjacent to the selected tile, and the first or the second row switching unit of the adjacent tile, and
  the tiles, adjacent to the selected tile, are positioned adjacent to the selected tile along an extending direction of the word line.

7. The resistance variable memory device of claim 1, wherein the decoding circuit comprises:
  a first column switching unit for controlling left columns among the columns; and
  a second column switching unit for controlling right columns among the columns,
  wherein the first column switching unit is arranged at one end of each of the left columns, and the second column switching unit is arranged at the other end of each of the right columns.

8. The resistance variable memory device of claim 7, wherein the first column switching unit includes column switching transistors arranged at one end of each of the left columns, and the second column switching unit includes column switching transistors arranged at the other end of each of the right columns.

9. The resistance variable memory device of claim 8, wherein the second level of the bit line positioned at the selected column of the selected tile is electrically connected with the first level of the bit line, positioned at the selected column of a tile adjacent to the selected tile, and the first or the second column switch of the selected tile,
  the first level of the bit line positioned at the selected column of the selected tile is electrically connected with the second level of the bit line, positioned at the selected column of a tile adjacent to the selected tile, and the first or the second column switch of the adjacent tile, and
  the tiles, adjacent to the selected tile, are positioned adjacent to the selected tile along an extending direction of the bit line.

10. The resistance variable memory device of claim 9, wherein the first and second levels of the bit lines are arranged by a unit of the tile.

11. The resistance variable memory device of claim 9, wherein the first and second levels of the bit lines are extended by a unit of the two tiles without a disconnection, and the first and second levels of the bit lines are arranged in a stagger shape to be overlapped with each other on the selected tile.

12. The resistance variable memory device of claim 11, wherein the first and second levels of the bit lines is positioned at a same column overlap on a corresponding tile,
  central portions of the first and second levels of the bit lines, positioned at a same column, are arranged at both sides of the corresponding tile, and
  the central portions of the first and second levels of the bit lines are electrically connected with different column switching transistors positioned at different tiles.

13. The resistance variable memory device of claim 8, further comprising auxiliary bit line pads, partially overlapped with the column switching transistors by the columns and extended through gaps between the tiles, wherein the first and second levels of the bit lines are electrically connected with the column switching transistor through the auxiliary bit line pad.

14. The resistance variable memory device of claim 13, wherein the auxiliary bit line pad is positioned between a plane on which the column switching transistor is formed and a plane on which the first level of the word line is formed.

15. A resistance variable memory device comprising:
  a plurality of tiles;
  a control block;
  a first deck layer stacked on each of the tiles with the control block, the first deck layer including a first level of word lines, a first level of memory cells and a first level of bit lines sequentially stacked;
  a second deck layer stacked on the first level of the bit lines of the first deck layer, the second deck layer including a second level of memory cells and a second level of word lines sequentially stacked;

a third deck layer stacked on the second level of the word lines of the second deck layer, the third deck layer including a third level of memory cells and a second level of bit lines sequentially stacked; and a fourth deck layer stacked on the second level of the bit lines of the third deck layer, the fourth deck layer including a fourth level of memory cells and a third level of word lines sequentially stacked, wherein the first and third levels of the word lines of a selected row of a selected tile and the second level of the word lines of the selected row of a first tile adjacent to the selected tile are controlled by a row switching unit of the selected tile, and wherein the second level of the bit lines positioned at a selected column of a selected tile and the first level of the bit lines of a second tile adjacent to the selected tile are controlled by a column switching unit of the selected tile.

16. The resistance variable memory device of claim 15, wherein the control block comprises:

a first row switching unit including row switches provided to each of upper rows among the rows, disposed at one end of the rows;

a second row switching unit including the row switches provided to each of lower rows among the rows, disposed at the other end of the rows;

a first column switching unit including column switches provided to each of left columns among the columns, disposed at one end of the columns; and a second column switching unit including the column switches provided to each of right columns among the columns, disposed at the other end of the columns.

17. The resistance variable memory device of claim 15, further comprising an insulation layer positioned between a control block and the first deck layer and including a plurality of auxiliary bit line pads, wherein the auxiliary bit line pads partially overlap with the column switches and extend through gaps between the tiles.

18. The resistance variable memory device of claim 17, wherein the second level of the bit line of the selected tile and the first level of the bit line of the second tile are electrically connected with one of the column switches, positioned at the selected column of the selected tile through the auxiliary bit line pad, positioned at the selected column.

19. The resistance variable memory device of claim 15, wherein the first tile is any one of the tiles adjacent to the selected tile along a direction in which the word line extends, and the first tile is positioned adjacent to the row switch for controlling the selected row of the selected tile.

20. The resistance variable memory device of claim 15, wherein the second tile is any one of the tiles adjacent to the selected tile along a direction in which the bit line extends, and the second tile is positioned adjacent to the column switch for controlling the selected column of the selected tile.

21. The resistance variable memory device of claim 15, wherein the first to third levels of the word lines are separately arranged by a unit of the tile, and the first and second levels of the bit lines are separately arranged by the unit of the tile.

22. A resistance variable memory device comprising:

a first deck layer including a first level of word lines, a first level of memory cells and a first level of bit lines sequentially stacked;

a second deck layer arranged on the first level of the bit lines of the first deck layer, the second deck layer including a second level of memory cells and a second level of word lines sequentially stacked;

a third deck layer arranged on the second level of the word lines of the second deck layer, the third deck layer including a third level of memory cells and a second level of bit lines sequentially stacked; and a fourth deck layer arranged on the second level of the bit lines of the third deck layer, the fourth deck layer including a fourth level of memory cells and a third level of word lines sequentially stacked, wherein the first and second levels of the bit lines are extended by a unit of two tiles without a disconnection and the first and second levels of the bit lines are arranged in a stagger shape to overlap with each other on a selected tile, wherein a central portion of the first level of the bit line in the selected tile is electrically connected with the column switching unit of the selected tile, and wherein a central portion of the second level of the bit line in the selected tile is electrically connected with the column switching unit of a tile adjacent to the selected tile.

23. The resistance variable memory device of claim 22, wherein the column switching unit, provided to each of the tiles, comprises a column switching transistor provided to an edge portion of each of the columns in the tile, and an auxiliary bit line pad is arranged on the column switching transistor and connected with the first or the second level of the bit lines.

* * * * *